United States Patent
Kwon et al.

(10) Patent No.: US 8,670,269 B2
(45) Date of Patent: Mar. 11, 2014

(54) RESISTIVE MEMORY DEVICE AND METHOD OF WRITING DATA USING MULTI-MODE SWITCHING CURRENT

(75) Inventors: Oh-Seong Kwon, Hwaseong-si (KR); Jin-Hyun Kim, Yongin-si (KR); Hyun-Ho Choi, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 15 days.

(21) Appl. No.: 13/609,330

(22) Filed: Sep. 11, 2012

(65) Prior Publication Data

US 2013/0208535 A1 Aug. 15, 2013

(30) Foreign Application Priority Data

Feb. 14, 2012 (KR) .................. 10-2012-0014963

(51) Int. Cl.
*G11C 11/00* (2006.01)
*G11C 7/00* (2006.01)

(52) U.S. Cl.
USPC ........ 365/158; 365/171; 365/189.16; 365/201

(58) Field of Classification Search
USPC .......................... 365/158, 171, 173
See application file for complete search history.

(56) References Cited

U.S. PATENT DOCUMENTS

| | | | |
|---|---|---|---|
| 6,011,734 A | 1/2000 | Pappert | |
| 6,587,384 B2 | 7/2003 | Perner | |
| 7,088,608 B2 | 8/2006 | DeHerrera et al. | |
| 7,286,421 B2 | 10/2007 | Abraham et al. | |
| 2004/0088614 A1 | 5/2004 | Wu | |
| 2007/0153597 A1 | 7/2007 | Chang et al. | |
| 2009/0302837 A1 | 12/2009 | Phan Le et al. | |
| 2010/0014363 A1 | 1/2010 | Wang et al. | |
| 2010/0047929 A1 | 2/2010 | Hong et al. | |
| 2010/0080036 A1 | 4/2010 | Liu et al. | |
| 2010/0080048 A1 | 4/2010 | Liu et al. | |
| 2010/0110744 A1 | 5/2010 | El Baraji et al. | |
| 2010/0165710 A1 | 7/2010 | Nahas et al. | |
| 2010/0194431 A1 | 8/2010 | Chua-Eoan et al. | |
| 2010/0214825 A1 | 8/2010 | Chung et al. | |
| 2010/0315854 A1 | 12/2010 | Suzuki et al. | |
| 2010/0321976 A1 | 12/2010 | Jung et al. | |
| 2011/0007561 A1 | 1/2011 | Berger et al. | |
| 2011/0080773 A1 | 4/2011 | El Baraji et al. | |
| 2011/0122674 A1 | 5/2011 | Lin et al. | |
| 2011/0128771 A1 | 6/2011 | Rao | |
| 2011/0157971 A1 | 6/2011 | Kim et al. | |
| 2011/0170338 A1 | 7/2011 | Kim et al. | |
| 2011/0178768 A1 | 7/2011 | Jung et al. | |
| 2011/0188298 A1 | 8/2011 | Suzuki et al. | |
| 2011/0188305 A1 | 8/2011 | Yang | |
| 2011/0216580 A1 | 9/2011 | Berger et al. | |

*Primary Examiner* — Ly D Pham
(74) *Attorney, Agent, or Firm* — Volentine & Whitt, PLLC (57) ABSTRACT

A method of writing data in a resistive memory device includes performing a test operation to distinguish normal memory cells from weak memory cells, during a write operation directed to normal memory cells using a write current and during a weak write operation directed to weak memory cells using a higher write current.

20 Claims, 12 Drawing Sheets

RESISTIVE MEMORY DEVICE AND METHOD OF WRITING DATA USING MULTI-MODE SWITCHING CURRENT

CROSS-REFERENCE TO RELATED APPLICATION

This application claims priority under 35 U.S.C. §119 to Korean Patent Application No. 10-2012-0014963 filed on Feb. 14, 2012, the subject matter of which is hereby incorporated by reference.

BACKGROUND

The inventive concept relates to semiconductor memory devices and, more particularly, to resistive memory devices and methods of writing data in resistive memory devices Semiconductor memory devices may be classified as volatile and non-volatile in their operative natures. Non-volatile semiconductor memory devices have the advantage of retaining stored data in the absence of applied power, and have been widely used to store program code and/or data across a wide range of applications, including in particular computers and portable communication devices.

Due to continuing demand for high-capacity, low-power semiconductor memory devices, research has been conducted in certain advanced non-volatile memory devices that do not require data refresh. Advanced memory devices include, for example, the phase-change RAM (PRAM) that uses a phase-change material, the resistive RAM (RRAM) that uses a material having a variable resistive characteristic, such as a transition metal oxide, and the magnetic RAM (MRAM) that uses a ferromagnetic material. The materials used to fabricate advanced memory devices all exhibit a variable resistance property according to an applied current or voltage, and do not need to be refreshed because the materials retain said resistance property until changed.

In a resistive memory device, a unit memory cell may include a single variable resistive element and a single switching element. The variable resistive element may be connected between a bit line and the switching element, and the switching element may be connected between the variable resistive element and a word line. The resistive memory device may include a variable resistive memory cell array including individually programmable resistive memory cells.

SUMMARY

Embodiments of the inventive concept provide resistive memory devices and methods of operating same that are capable of different versions of multiple write operations distinguished by a multi-mode switching current.

In one embodiment, the inventive concept provides a resistive memory device comprising; a memory cell array including a plurality of memory cells arranged in a memory block defined by a plurality of rows, each row including a word line connecting memory cells, a control circuit configured to control a test operation, a normal write operation, and a weak write operation, as selectively applied to memory cells in the memory cell array, and a current supplying circuit that generates a first write current and a second write current having a higher level than the first write current, wherein the control circuit is further configured to distinguish normal memory cells from weak memory cells among the plurality of memory cells during the test operation, the weak memory cells being relatively poorly magnetized as compared with the normal memory cells, and the control circuit is still further configured to control application of the first write current to the normal memory cells during the normal write operation, and application of the second write current to the weak memory cells during the weak write operation.

In another embodiment, the inventive concept provides a method of writing data in a resistive memory device, wherein the resistive memory device includes a plurality of memory cells arranged in a memory block defined by a plurality of rows, each row including a word line connecting memory cells. The method comprises; performing a test operation on memory cells in the memory block to distinguish normal memory cells from weak memory cells among the plurality of memory cells, wherein the weak memory cells exhibit relatively poor magnetization, as compared with the normal memory cells, during a normal write operation directed to a row including normal memory cells, generating a first write current and applying the first current to the normal memory cells, and during a weak write operation directed to a row including weak memory cells, generating a second write current having a higher level than the first write current and applying the second current to the weak memory cells.

BRIEF DESCRIPTION OF THE DRAWINGS

The foregoing and other features and advantages of the inventive concepts will be apparent from the embodiments of the inventive concepts illustrated in the accompanying drawings. In the drawings.

DETAILED DESCRIPTION

Certain embodiments of the inventive concept will now be described in some additional detail with reference to the accompanying drawings. The inventive concept may, however, be variously embodied and should not be construed as being limited to only the illustrated embodiments.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. Meanwhile, spatially relative terms, such as "between" and "directly between" or "adjacent to" and "directly adjacent to" and the like, which are used herein for ease of description to describe one element or feature's relationship to another element(s) or feature(s) as illustrated in the figures, should be interpreted similarly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless expressly defined in a specific order herein, respective steps described in the inventive concept may be performed otherwise. That is, the respective steps may be performed in a specified order, substantially at the same time, or in reverse order.

Figure 1:
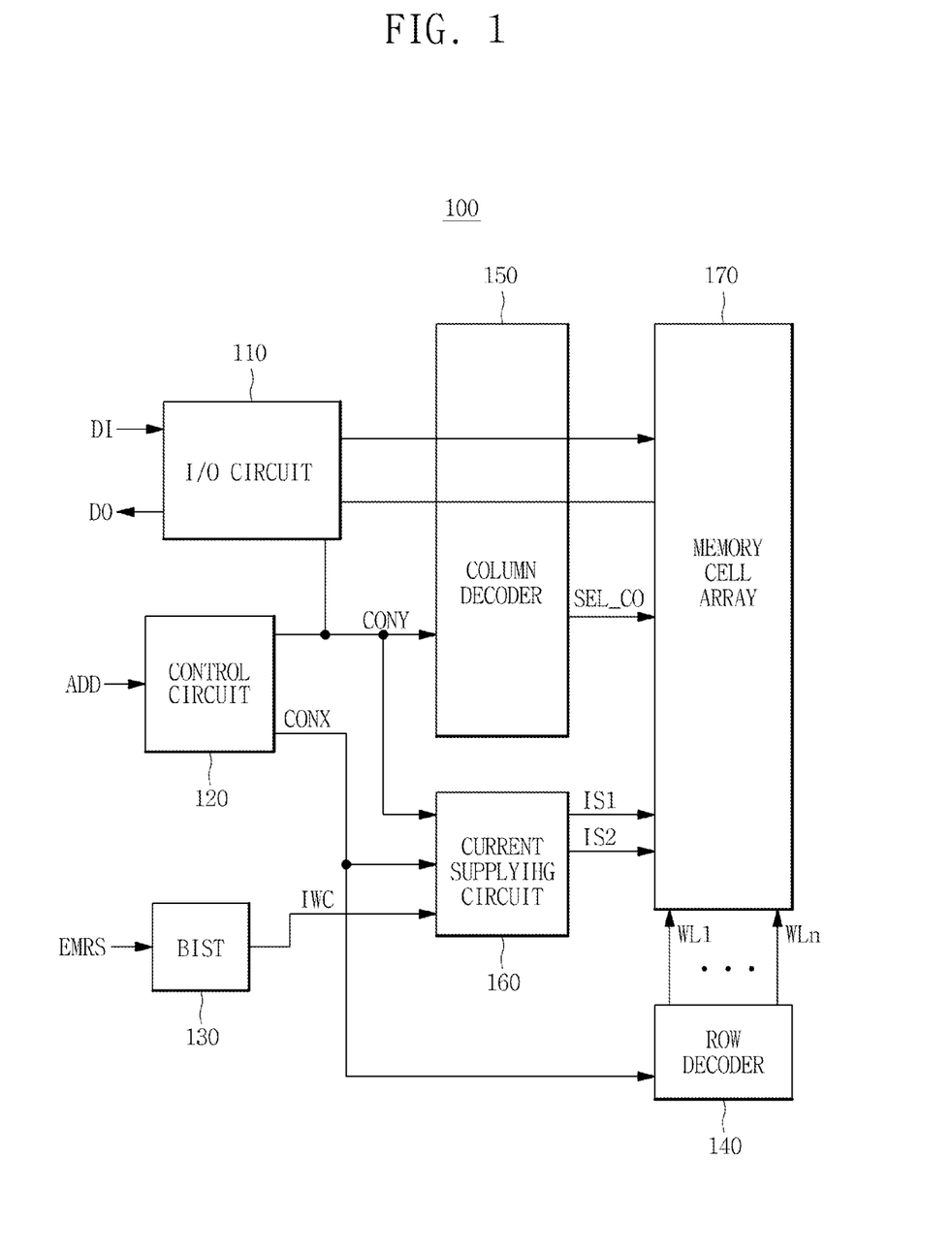
FIG. 1 is a block diagram of a resistive memory device according to an embodiment of the inventive concept.

FIG. 1 is a block diagram of a resistive memory device 100 according to an embodiment of the inventive concept.

Referring to FIG. 1, the exemplary resistive memory device 100 generally includes an input/output (I/O) circuit 110, a control circuit 120, a built-in self-test (BIST) circuit 130, a row decoder 140, a column decoder 150, a current supplying circuit 160, and a memory cell array 170.

The memory cell array 170 may be selectively enabled by word line driving signals WL1 to WLn and a column selection signal SEL_CO. The control circuit 120 may be used to control signal timing and voltage level of an address signal ADD and generate a row control signal CONX and a column control signal CONY. The row decoder 140 will then decode the row control signal CONX, generate word line driving signals WL1 to WLn, and transmit the word line driving signals WL1 to WLn to the memory cell array 170. The column decoder 150 may be used to decode the column control signal CONY, generate the column selection signal SEL_CO, and transmit the column selection signal SEL_CO to the memory cell array 170. The current supplying circuit 160 may be used to generate a first current IS1 and a second current IS2 having a higher level than the first current IS1 in view of weak cell information IWC. The current supplying circuit 160 may also be used to supply the first current IS1 and the second current IS2 to the memory cell array 170. Here, the term "weak cell" refer to memory cells that exhibit relatively poor magnetization, as compared with nominally operating or "normal" memory cells. Thus, a larger switching current is typically required to magnetize a weak cell than is to magnetize a normal cell.

The BIST circuit 130 may be used to generate the weak cell information IWC in relation to data stored in (e.g.) an extended mode register set (EMRS). The I/O circuit 110 may be sued to transmit input data DI to the memory cell array 170 in response to the column control signal CONY during a write operation mode, and sense and amplify a voltage apparent on a bit line in response to the column control signal CONY and generate output data DO during a read operation mode. The current supplying circuit 160 may operate in response to the weak cell information IWC, the row control signal CONX, and the column control signal CONY. In certain embodiments of the inventive concept, the resistive memory device of FIG. 1 may be a magnetic random access memory (MRAM).

Figure 2:
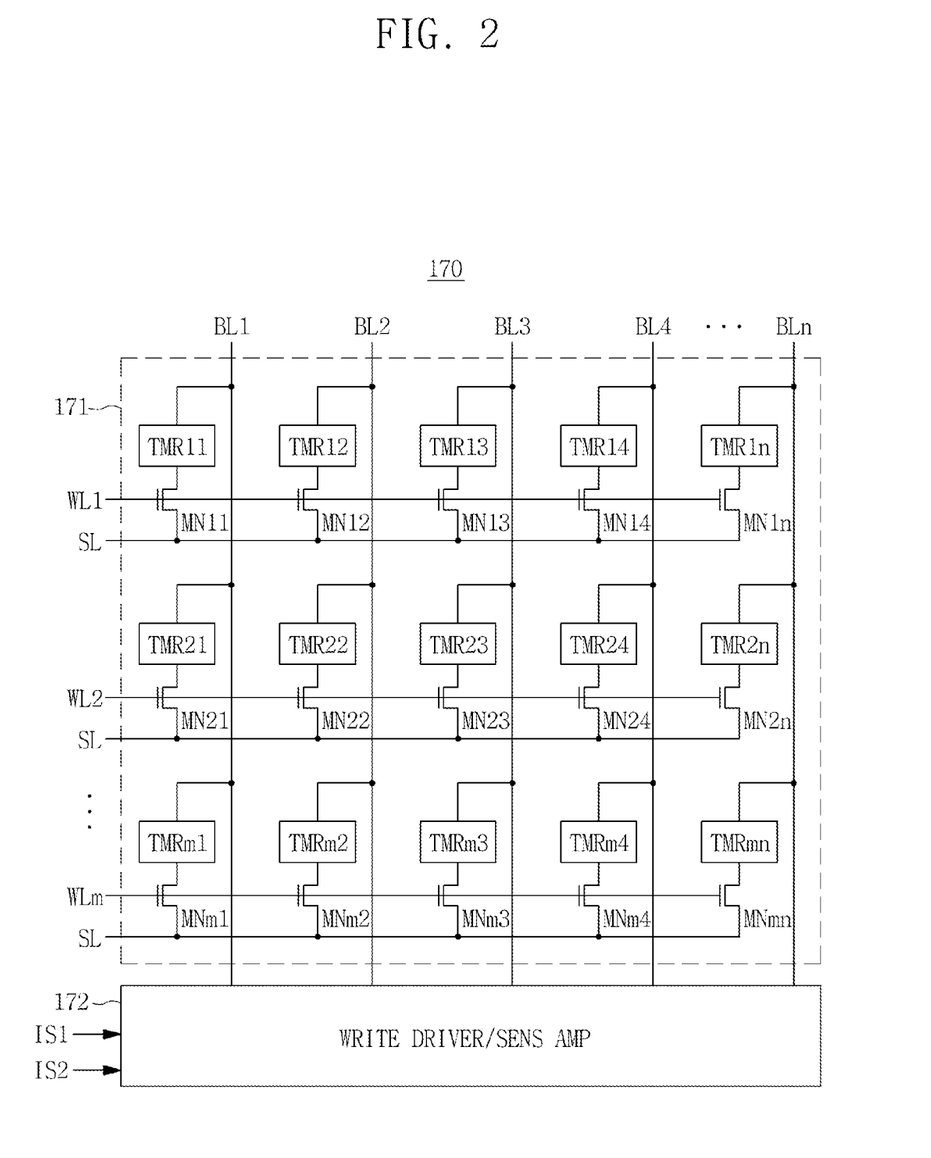
FIG. 2 is a partial circuit diagram further illustrating the memory cell array of the resistive memory device of FIG. 1.

FIG. 2 is a partial circuit diagram further illustrating the memory cell array 170 of the resistive memory device 100 of FIG. 1.

Referring to FIG. 2, the exemplary memory cell array 170 includes a memory cell array 171 and an I/O buffer 172 including a write driver and a sense amplifier (SA).

The cell array unit 171 includes a plurality of tunneling magneto-resistance (TMR) elements TMR11 to TMR1$n$, TMR21 to TMR2$n$, . . . , and TMRm1 to TMRmn and transistors MN11 to MN1$n$, MN21 to MN2$n$, . . . , and MNm1 to MNmn connected in series to the respective TMR elements TMR11 to TMR1$n$, TMR21 to TMR2$n$, . . . , and TMRm1 to TMRmn. The I/O buffer 172 may be used to sense and amplify output signals from the cell array unit 171, and to perform write operations on the cell array unit 171 based on the first and second currents IS1 and IS2 received from the current supplying circuit 160.

Each of the TMR elements TMR11 to TMR1$n$, TMR21 to TMR2$n$, . . . , and TMRm1 to TMRmn may have a first terminal connected to the corresponding one of a plurality of bit lines BL1 to BLn, and each of the NMOS transistors MN11 to MN1$n$, MN21 to MN2$n$, . . . , and MNm1 to MNmn may have a drain connected to a second terminal of the corresponding one of the TMR elements TMR11 to TMR1$n$, TMR21 to TMR2$n$, . . . , and TMRm1 to TMRmn, a gate connected to the corresponding one of a plurality of word lines WL1 to WLm, and a source connected to a source line SL.

Figure 3:
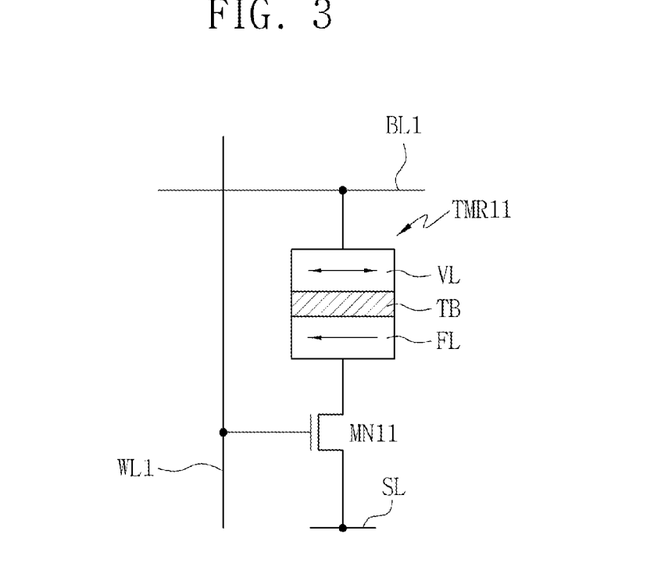
FIG. 3 is a circuit diagram illustrating one example of a magnetic random access memory (MRAM) cell that may be used in the memory cell array of FIG. 2.

FIG. 3 is a circuit diagram illustrating in some additional detail one example of a MRAM cell that may be used in the memory cell array 170 of FIG. 2.

Referring to FIG. 3, the MRAM cell includes the TMR element TMR11 and the NMOS transistor MN11. The TMR element TMR11 has a first terminal connected to the bit line BL1, and the NMOS transistor MN11 has a drain connected to a second terminal of the TMR11, a gate connected to the word line WL1, and a source connected to the source line SL.

The TMR element TMR11 includes a fixed magnetic layer FL having a predetermined fixed magnetization direction, a variable magnetic layer VL capable of being magnetized in a direction defined by an externally applied magnetic field, and a tunnel barrier layer TB including an insulating film interposed between the fixed magnetic layer FL and the variable magnetic layer VL.

Figure 4:
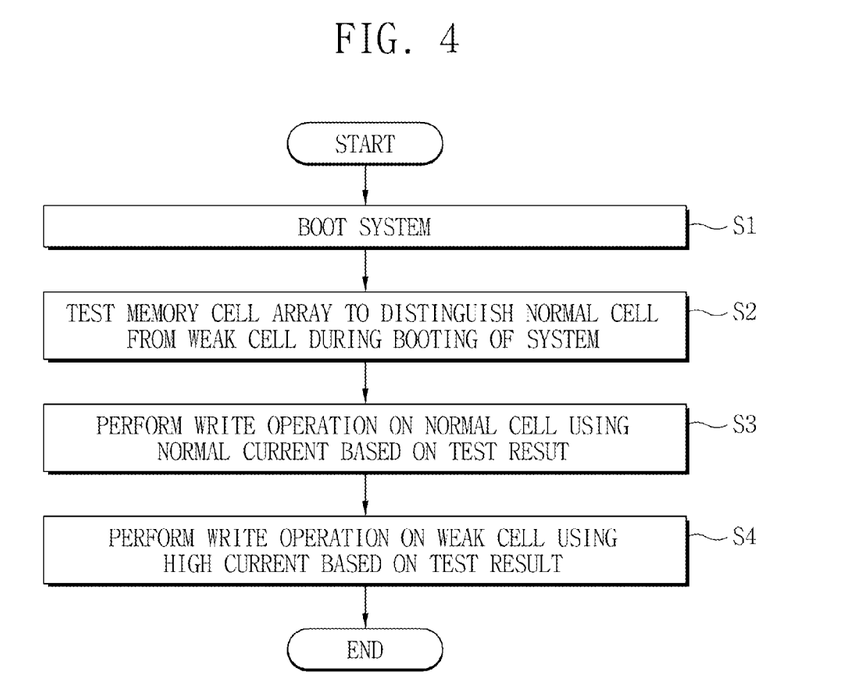
FIG. 4 is a flowchart summarizing a method of writing data in a resistive memory device according to an embodiment of the inventive concept.

FIG. 4 is a flowchart summarizes a method of writing data in a resistive memory device according to an embodiment of the inventive concept.

Referring to FIG. 4, the exemplary method of writing data in the resistive memory device includes: booting the system (S1), and during the system boot procedures, testing (e.g., performing a test operation) the memory cells in the memory cell array to distinguish normal memory cells from weak memory cells (S2). Then, a (normal) write operation may be performed on one or more normal memory cells using "a first (normal) write current" based on the testing result (S3), and a (weak) write operation may be performed on one or more weak memory cells using "a second (high) write current" that is greater than the normal write current and is also based on the testing result (S4). It should be noted at this point that the normal write current and the high write current may be variably and dynamically defined by the memory cell performance testing. However, the high write current will always be greater than the normal write current due the inherent performance characteristics distinguishing weak memory cells from normal memory cells (e.g., magnetization abilities).

Figure 5:
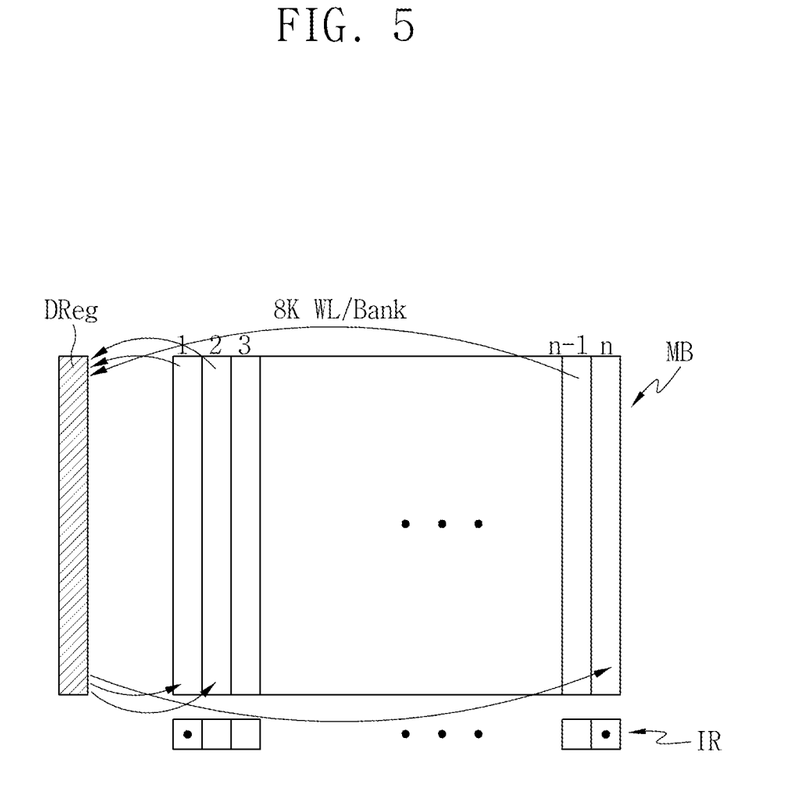
FIGS. 5 and 6 are respectively a block diagram and flowchart that collectively illustrate in one example a testing operation that may be used in the method of writing data in the resistive memory device of FIG. 4.
Figure 6:
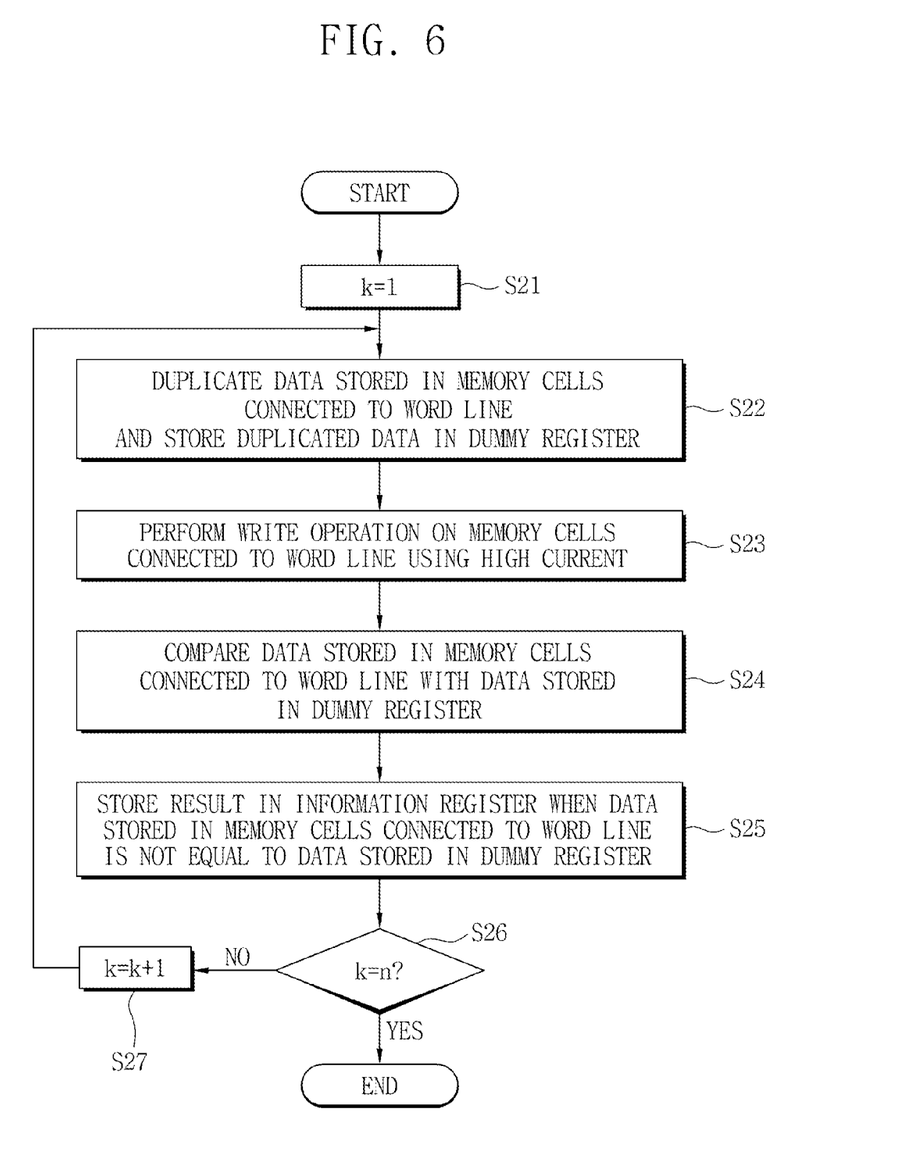

FIGS. 5 and 6 are respectively a block diagram and flowchart collectively illustrating one example of a testing method that may be applied to the memory cell array during the method of writing data in the resistive memory device of FIG. 4.

Referring to FIG. 5, the resistive memory device includes a memory bank MB defined by "n" rows, a dummy register "DReg" and an information register "IR". The dummy register DReg may be included in the BIST circuit 130 of FIG. 1, and as such may be disposed external to (or outside) the memory block MB. In the example of FIG. 5, each memory bank MB of the resistive memory device is assumed to include 8K rows. Each of the n rows corresponds to a single word line connecting memory cells.

Referring to FIGS. 5 and 6, the exemplary testing method includes: setting (initializing) an iteration value "k" to 1 (S21), duplicating data stored in memory cells connected to a word line and storing the duplicated data in the dummy register DReg (S22).

Then, a write operation may be performed on memory cells connected to the word line using the high write current (S23), and the data stored in the memory cells connected to the word line may be compared with the data stored in the dummy register (S24). And when the data stored in the memory cells connected to the word line is not equal to the data stored in the dummy register DReg, weak cell information may be stored in an information register IR (S25).

The iteration value k is then compared to the number of rows "n" to determine whether all word lines have been tested (S26). If S26=YES, the testing method terminates, otherwise if S26=NO, the iteration value k is incremented (S27) and the testing method continues to the next (k+1) row.

Figure 7:
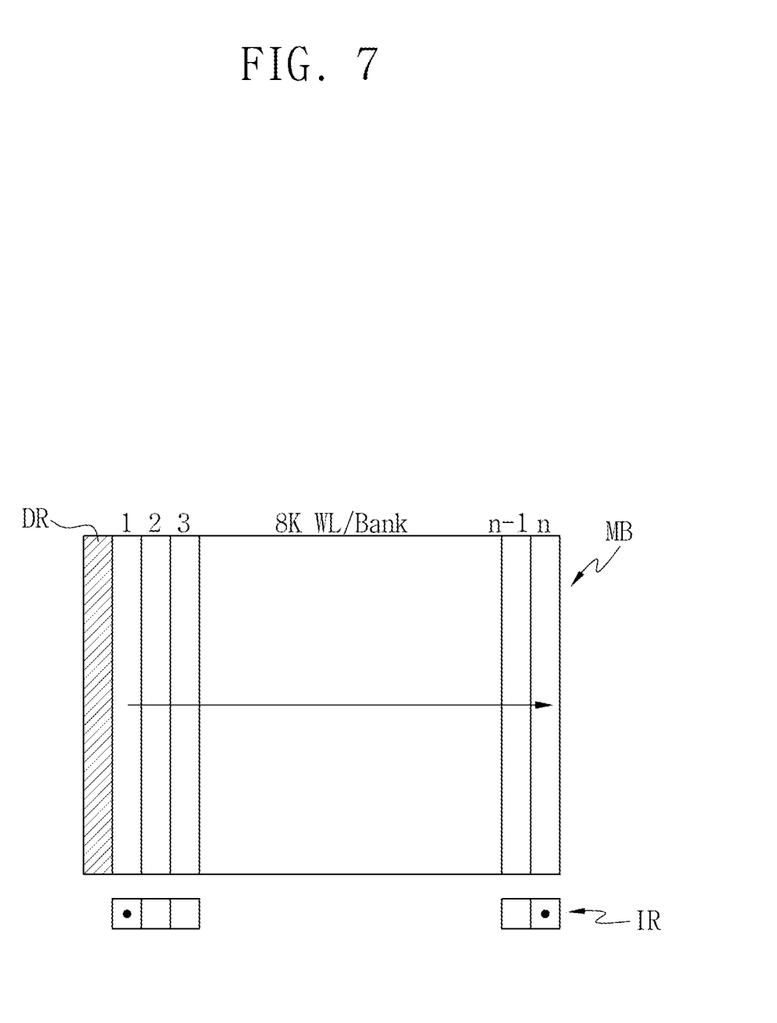
FIGS. 7 and 8 are respectively a block diagram and flowchart that collectively illustrate in another example a testing operation that may be used in the method of writing data in the resistive memory device of FIG. 4.
Figure 8:
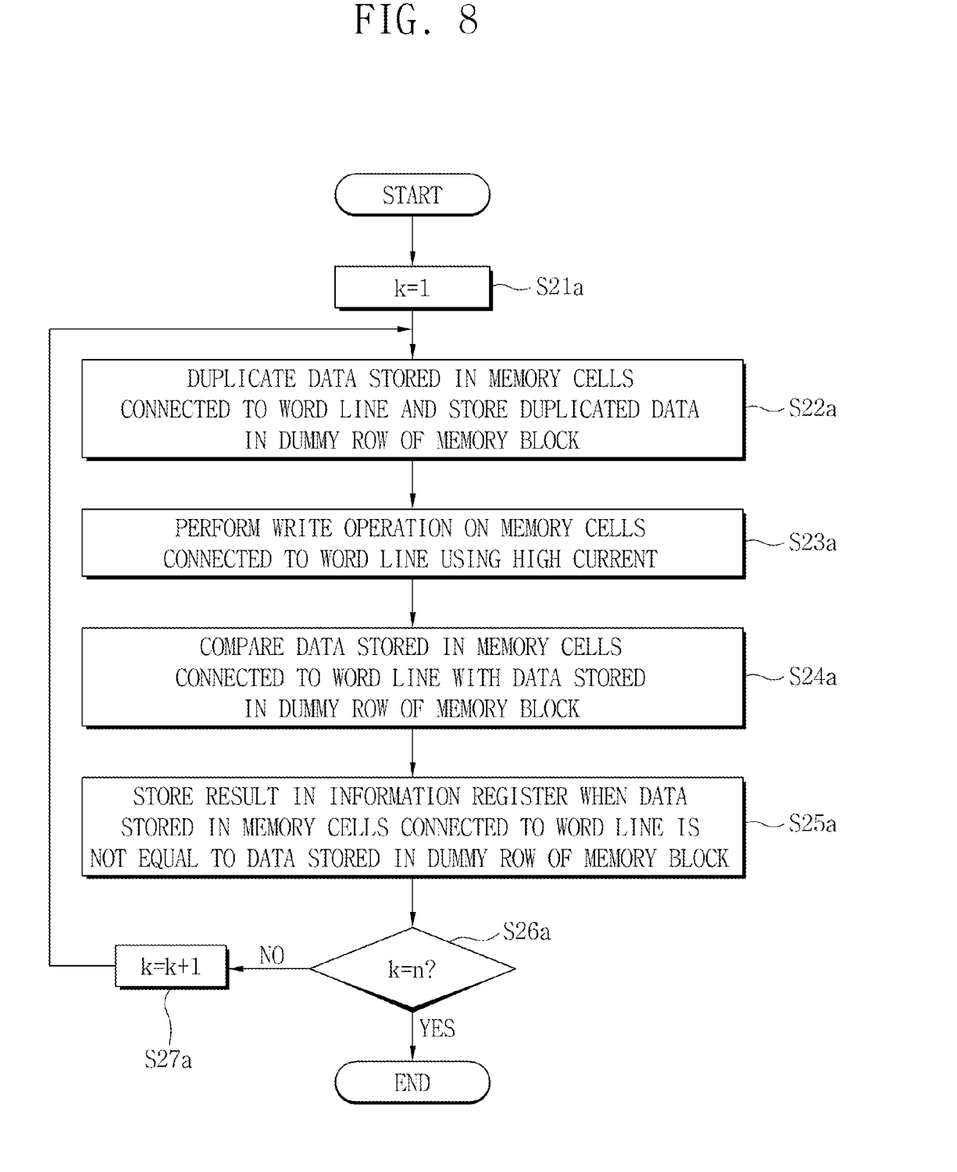

FIGS. 7 and 8 are respectively a block diagram and flowchart collectively illustrating another example of a testing method that may be applied to the memory cell array during the method of writing data in the resistive memory device of FIG. 4.

Referring to FIG. 7, the resistive memory device again includes a memory bank MB defined by "n" rows, the dummy row "DR", and an information register IR. The dummy row DR may be disposed adjacent to (and therefore integral with) the memory bank MB and have the same configuration as any one of the n (normal) rows in the memory bank MB. In the example of FIG. 7, each memory bank of the resistive memory device is again assumed to include 8K rows, wherein each row corresponds to a single word line connecting memory cells.

Referring to FIG. 8, a testing method for the memory cell array includes: setting (initializing) an iteration value "k" to 1 (S21a), duplicating data stored in memory cells connected to a word line and storing the duplicated data in the dummy row DR (S22a).

Then, a write operation may be performed on memory cells connected to the word line using the high write current (S23a), and the data stored in the memory cells connected to the word line may be compared with the data stored in the dummy row of the memory block (S24a). And when the data stored in the memory cells connected to the word line is not equal to the data stored in the dummy row of the memory block, weak cell information may be stored in an information register IR (S25a).

The iteration value k is then compared to the number of rows "n" to determine whether all word lines have been tested (S26a). If S26a=YES, the testing method terminates, otherwise if S26a=NO, the iteration value k is incremented (S27a) and the testing method continues to the next (k+1) row.

Figure 9:
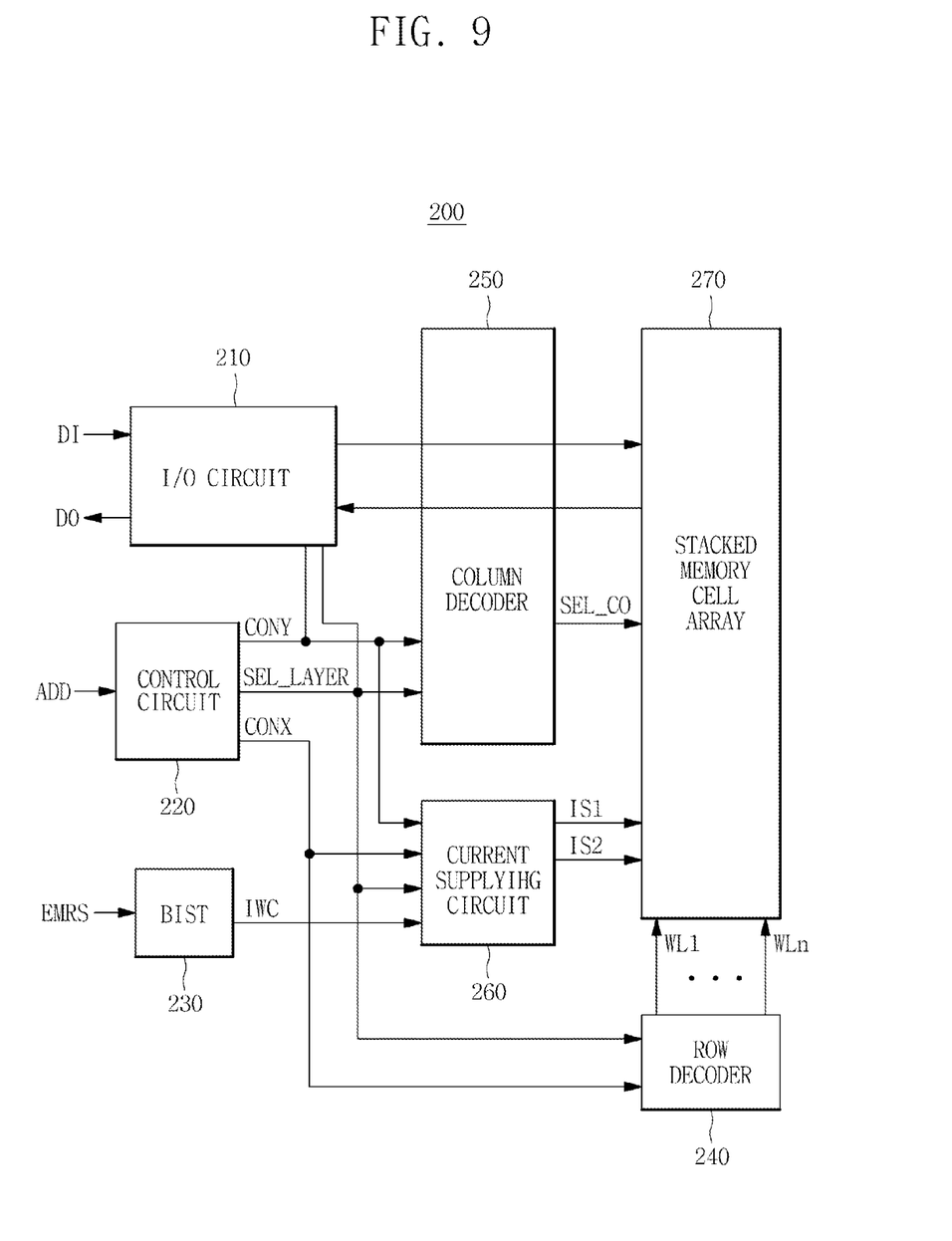
FIG. 9 is a block diagram of a resistive memory device according to another embodiment of the inventive concept.

FIG. 9 is a block diagram of a resistive memory device 200 according to another embodiment of the inventive concept.

Referring to FIG. 9, the resistive memory device 200 may include an I/O circuit 210, a control circuit 220, a BIST circuit 230, a row decoder 240, a column decoder 250, a current supplying circuit 260, and a stacked memory cell array 270.

The stacked memory cell array 270 may be enabled in response to word line driving signals WL1 to WLn and a column selection signal SEL_CO. The control circuit 220 may control the signal timing and voltage level of an address signal ADD and generate a row control signal CONX, a column control signal CONY, and a layer selection signal SEL_LAYER. The row decoder 240 may be used to decode the row control signal CONX and the layer selection signal SEL_LAYER, generate word line driving signals WL1 to WLn, and transmit word line driving signals WL1 to WLn to the memory cell array 170. The column decoder 250 may be used to decode the column control signal CONY and the layer selection signal SEL_LAYER, generate a column selection signal SEL_CO, and transmit the column selection signal SEL_CO to the memory cell array 270. The current supplying circuit 260 may be used to generate a first current IS 1 and a second current IS2 having a higher level than the first current IS1 based on weak cell information IWC and transmit the first current IS1 and the second current IS2 to the memory cell array 270. Here again, a relatively large switching current may be required to magnetize weak memory cells, as compared with normal memory cells.

The BIST circuit 230 may be used to generate weak cell information IWC based on an EMRS signal. The I/O circuit 210 may be used to transmit input data DI to the memory cell array 270 in response to the column control signal CONY and the layer selection signal SEL_LAYER during a write operation mode, and sense and amplify a voltage of a bit line in response to the column control signal CONY and the layer selection signal CEL_LAYER and generate output data DO during a read operation mode. The current supplying circuit 260 may operate in response to the weak cell information IWC, the row control signal CONX, the column control signal CONY, and the layer selection signal SEL_LAYER. As above, the resistive memory device of FIG. 9 is assumed to be a magnetic random access memory (MRAM) having a stacked memory cell array.

Figure 10:
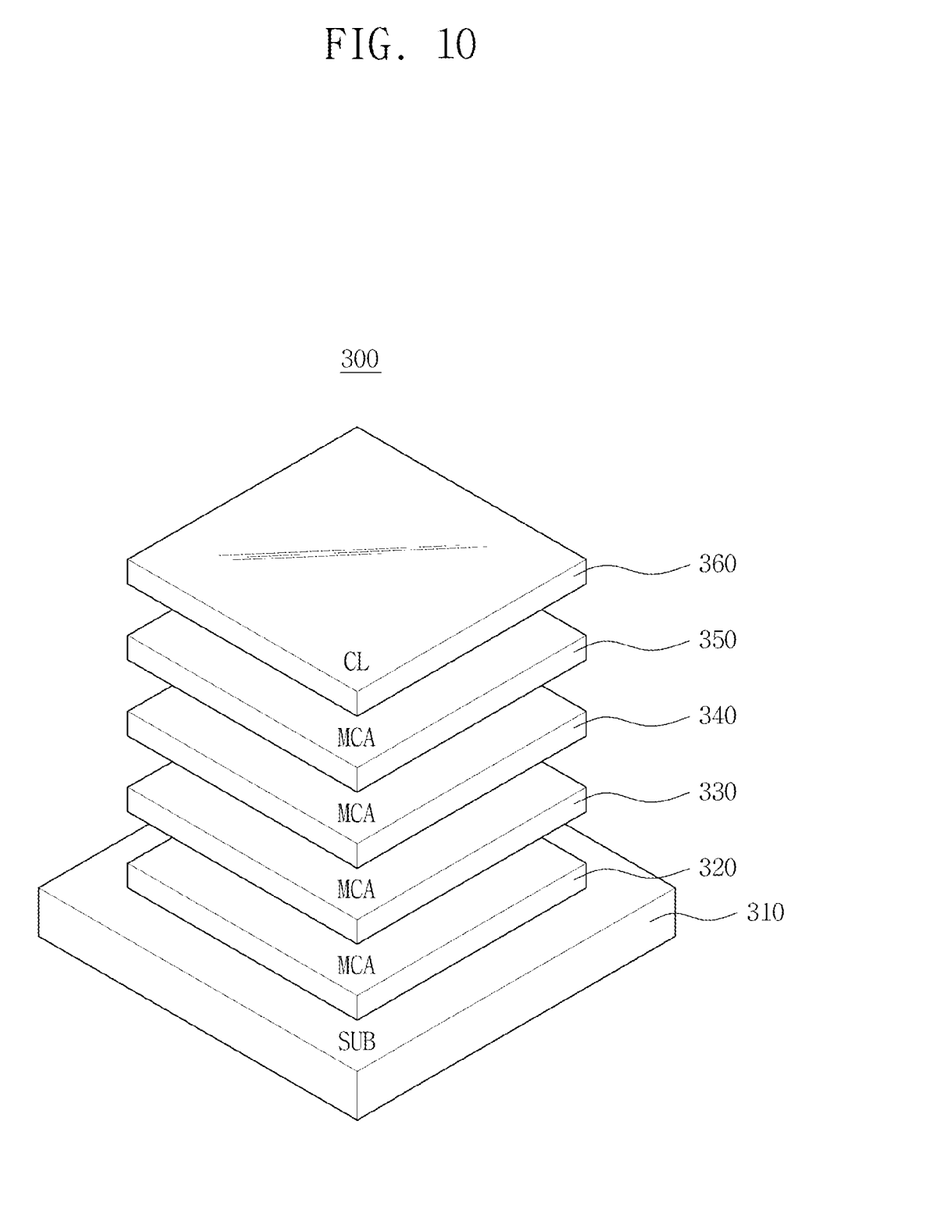
FIG. 10 is a perspective view of the stacked, three-dimensional memory cell array in the device of FIG. 9.

FIG. 10 is a perspective view of a 3-dimensional structure of a resistive memory device 300 according to another embodiment of the inventive concept. The resistive memory device of FIG. 10 may include a stacked memory cell array.

Referring to FIG. 10, the resistive memory device 300 may include a semiconductor substrate 310, memory cell array layers 320, 330, 340, and 350 and a connection layer 360.

The semiconductor substrate 310 may include function circuits shown in FIG. 9, such as the I/O circuit 210, the control circuit 220, the row decoder 240, and the column decoder 250. The memory cell array layers 320, 330, 340, and 350 may be stacked on the semiconductor substrate 310. The connection layer 360 may be stacked over the semiconductor substrate 310 independently from the memory cell array layers 320, 330, 340, 350 and electrically connect memory cell selection lines disposed in the memory cell array layers 320, 330, 340, and 350 with the function circuits included in the semiconductor substrate 310.

Figure 11:
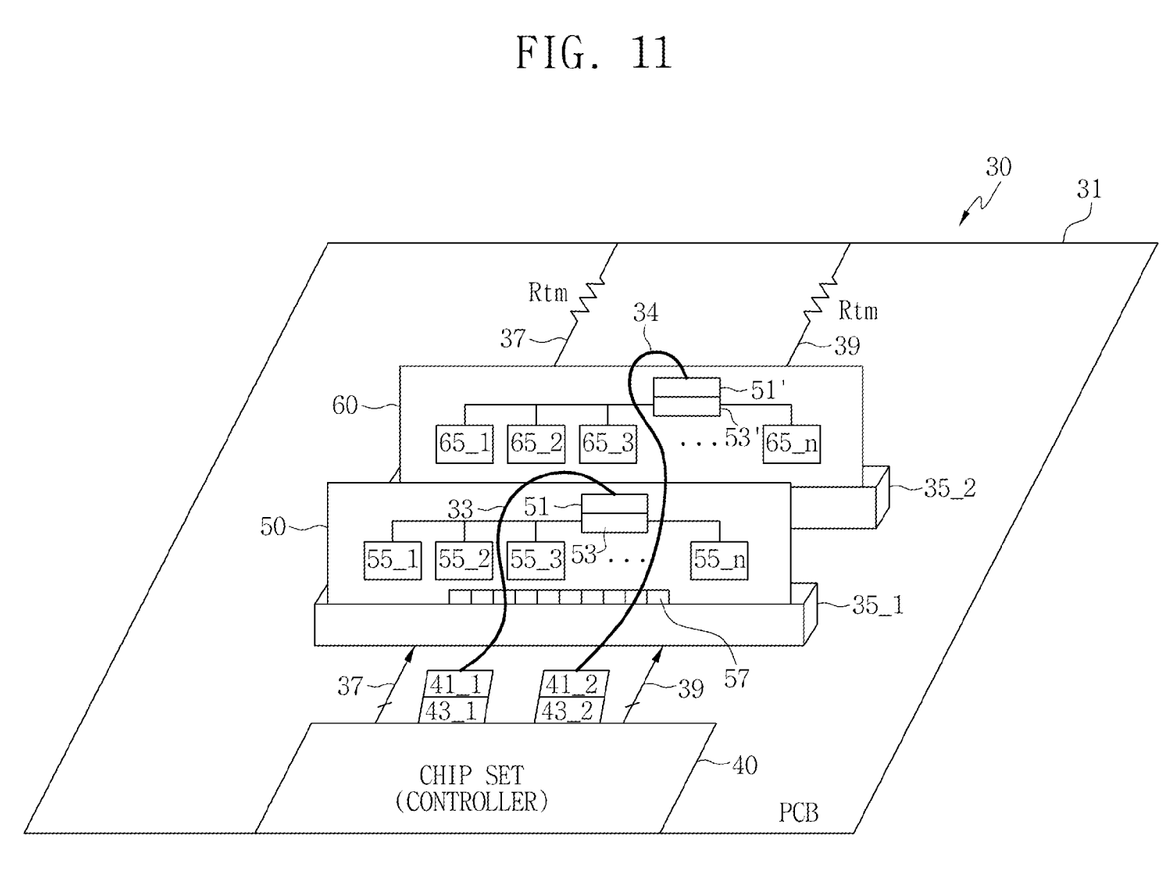
FIG. 11 is a diagram illustrating one example of a memory system including a resistive memory device according to embodiments of the inventive concept.

FIG. 11 is a diagram illustrating one example of a memory system 30 including a resistive memory device according to embodiments of the inventive concept.

Referring to FIG. 11, the exemplary memory system 30 includes a mother board 31, a chipset (or controller) 40, slots 35_1 and 35_2, memory modules 50 and 60, and transmission wires 33 and 34. Buses 37 and 39 may connect the chipset 40 to the slots 35_1 and 35_2. A terminal resistor Rtm may terminate each of the buses 37 and 39 disposed on a printed circuit board (PCB) of the mother board 31.

Although FIG. 11 illustrates two slots 35_1 and 35_2 and two memory modules 50 and 60 for brevity, the memory system 30 may include an arbitrary number of slots and an arbitrary number of memory modules.

The chipset 40 may be mounted on the PCB of the mother board 31 and control an operation of the memory system 30. The chipset 40 may include connectors 41_1 and 41_2 and converters 43_1 and 43_2.

The converter 43_1 may receive parallel data generated by the chipset 40, convert the parallel data into serial data, and output the serial data to the transmission wire 33 through the connector 41-1. The converter 43_1 may receive serial data through the transmission wire 33, convert the serial data into parallel data, and output the parallel data to the chipset 40.

The converter 43_2 may receive the parallel data generated by the chipset 40, convert the parallel data into serial data, and output the serial data to the transmission wire 34 through the connector 41-2. The converter 43_2 may receive serial data through the transmission wire 34, convert the serial data into parallel data, and output the parallel data to the chipset 40. The transmission wires 33 and 34 included in the memory system 30 may be a plurality of optical fibers.

The memory module 50 may include a plurality of memory devices 55_1 to 55_n, a first connector 57, a second connector 51, and converters 53. The memory module 60 may include a plurality of memory devices 65_1 to 65_n, a first connector 57', a second connector 51', and converters 53'.

The first connector 57 may transmit a low-speed signal from the chipset 40 to memory devices, while the second connector 51 may be connected to the transmission wire 33 configured to transmit a high-speed signal.

The converter 53 may receive serial data through the second connector 51, convert the serial data into parallel data, and output the parallel data to the plurality of memory devices 55_1 to 55_n. Also, the converter 53 may receive parallel data from the plurality of memory devices 55_1 to 55_n, convert the parallel data into serial data, and output the serial data to the second connector 51.

Figure 12:
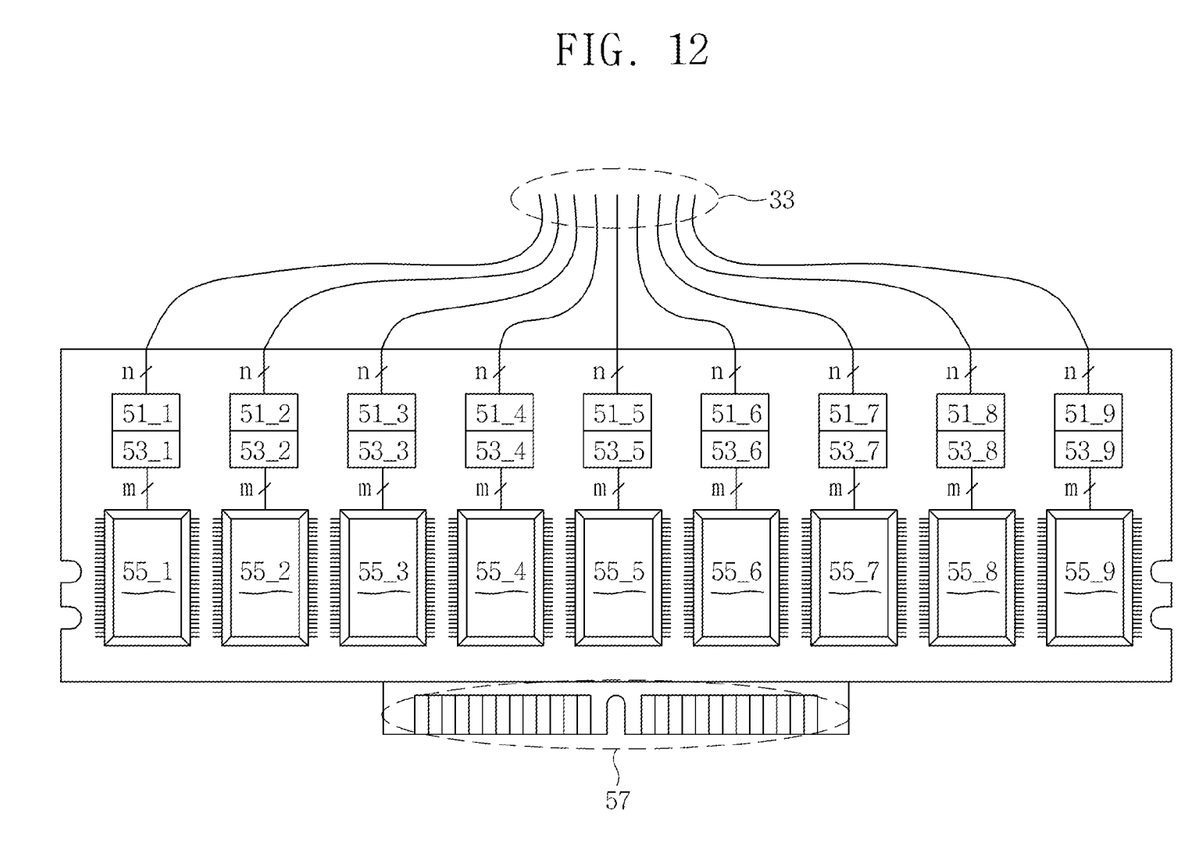
FIG. 12 is a diagram illustrating a memory module constituting the memory system of FIG. 11.

The plurality of memory devices 55_1 to 55_n and 65_1 to 65_n shown in FIG. 12 may be resistive memory devices according to embodiments of the inventive concept. Accordingly, each of the plurality of memory devices 55_1 to 55_9 may perform a write operation on normal memory cells and weak memory cells using switching currents having different magnitudes.

FIG. 12 is a diagram illustrating a memory module incorporating the memory system of FIG. 11.

Referring to FIG. 12, the memory module may include a first connector 57, a plurality of memory devices 55_1 to 55_9, a plurality of converters 53_1 to 53_9, and a plurality of second connectors 51_1 to 51_9. As shown in FIG. 12, transmission wires 33 may be a plurality of optical fibers.

The plurality of memory devices 55_1 to 55_9 shown in FIG. 12 may be resistive memory devices according to embodiments of the inventive concept. Accordingly, each of the plurality of memory devices 55_1 to 55_9 may perform a write operation on normal cells and weak cells using switching currents having different magnitudes.

Figure 13:
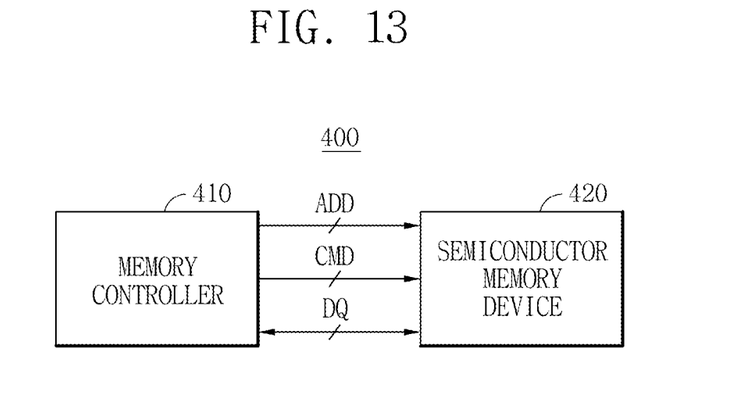
FIG. 13 is a diagram illustrating another example of the memory system including the resistive memory device according to the embodiments of the inventive concept.

FIG. 13 is a block diagram illustrating another example of a memory system 400 including a resistive memory device according to embodiments of the inventive concept.

Referring to FIG. 13, the memory system 400 may include a memory controller 410 and a semiconductor memory device 420.

The memory controller 410 may generate an address signal ADD and a command CMD and transmit the address signal ADD and the command CMD to the semiconductor memory device 420 through buses. Data DQ may be transmitted from the memory controller 410 to the semiconductor memory device 420 through the buses or transmitted from the semiconductor memory device 420 to the memory controller 410 through the buses.

The semiconductor memory device 420 may be a resistive memory device according to embodiments of the inventive concept. Accordingly, the semiconductor memory device 420 may perform a write operation on normal memory cells and weak memory cells using switching currents having different magnitudes.

Figure 14:
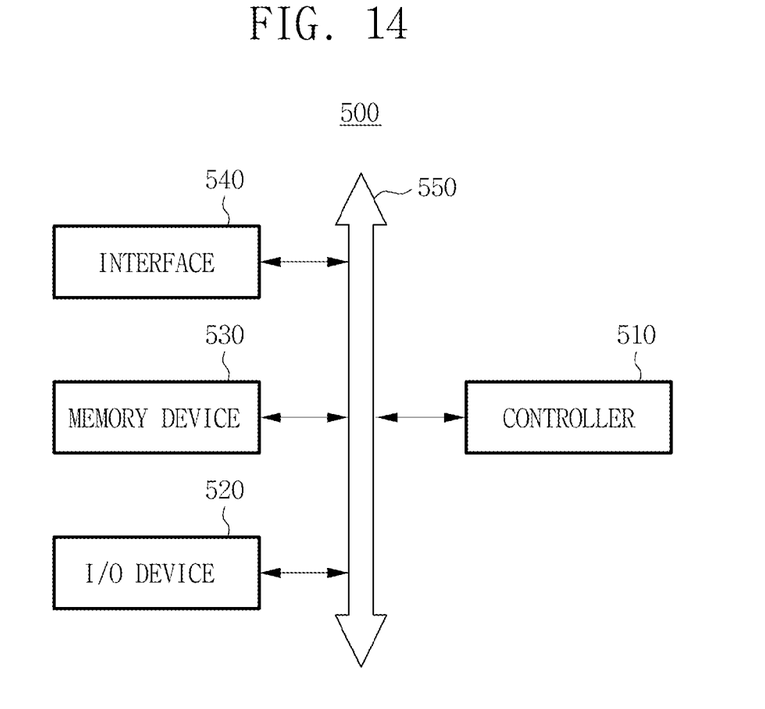
FIG. 14 is a block diagram illustrating an example of an electronic system including a resistive memory device according to embodiments of the inventive concept.

FIG. 14 is a block diagram illustrating one example of an electronic system 500 including a semiconductor memory device according to embodiments of the inventive concept.

Referring to FIG. 14, the electronic system 500 according to the embodiments of the inventive concept may include a controller 510, an I/O device 520, a memory device 530, an interface 540, and a bus 550. The bus 550 may provide a path through which data may be transmitted among the controller 510, the I/O device 520, the memory device 530, and the interface 540.

The controller 510 may include at least one of at least one microprocessor (MP), at least one digital signal processor (DSP), at least one microcontroller (MC), and logic devices capable of similar functions thereto. The I/O device 520 may include at least one of a keypad, a keyboard, and a display device. The memory device 530 may serve to store data and/or commands executed by the controller 510.

The memory device 530 may include a volatile memory chip, such as a dynamic random access memory (DRAM) or a static RAM (SRAM), a non-volatile memory chip, such as a flash memory, a phase-change memory, a magnetic RAM (MRAM), or a resistive RAM (RRAM), or a combination thereof. The memory device 530 may include a resistive memory device according to embodiments of the inventive concept. The resistive memory device included in the memory device 530 may perform a write operation on normal memory cells and weak memory cells using switching currents having different magnitudes.

The interface 540 may serve to transmit data to a communication network or receive data from the communication network. The interface 540 may include an antenna or a wired/wireless transceiver and transmit/receive data by wire or wirelessly. Also, the interface 540 may include an optical fiber and transmit/receive data through the optical fiber. An application chipset, a camera image processor (CIP), and an I/O device may be further provided in the electronic system 500.

The electronic system 500 may be embodied by a mobile system, a personal computer (PC), an industrial computer, or a logic system with various functions. For example, the mobile system may be any one of a personal digital assistant (PDA), a portable computer (PC), a web tablet, a mobile phone, a wireless phone, a laptop computer, a memory card, a digital music system, and a data transmission/receiving system. When the electronic system 500 is an apparatus capable of wireless communication, the electronic system 500 may be used for a communication system, such as a code division multiple access (CDMA), a global system for mobile communication (GSM), a North American digital cellular (NADC), an enhanced-time division multiple access (E-TDMA), a wideband code division multiple access (WCDMA), or CDMA2000.

The inventive concept may be applied to a semiconductor device, particularly, a resistive memory device, such as an MRAM.

Since a resistive memory device according to embodiments of the inventive concept writes data using a multi-mode switching current, the power consumption of the resistive memory device can be reduced, and the reliability of memory cells can be improved. Furthermore, since transistors of the memory cells can be downscaled, the embodiments of the inventive concept can be appropriate for embodying high-capacity highly integrated resistive memory devices.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims.

What is claimed is:

1. A resistive memory device comprising:
a memory cell array including a plurality of memory cells arranged in a memory block defined by a plurality of rows, each row including a word line connecting memory cells;
a control circuit configured to control a test operation, a normal write operation, and a weak write operation, as selectively applied to memory cells in the memory cell array; and
a current supplying circuit that generates a first write current and a second write current having a higher level than the first write current,
wherein the control circuit is further configured to distinguish normal memory cells from weak memory cells among the plurality of memory cells during the test operation, the weak memory cells being relatively poorly magnetized as compared with the normal memory cells, and
the control circuit is still further configured to control application of the first write current to the normal memory cells during the normal write operation, and application of the second write current to the weak memory cells during the weak write operation.

2. The resistive memory device of claim 1, wherein the control circuit distinguishes the normal memory cells from the weak memory cells in accordance with weak cell information derived during the test operation.

3. The resistive memory device of claim 1, further comprising:
a built-in self-test (BIST) circuit configured to generate the weak cell information in accordance with an externally provided extended mode register set signal (EMRS).

4. The resistive memory device of claim 3, wherein the BIST comprises a dummy register.

5. The resistive memory device of claim 4, wherein the control circuit and the BIST are further configured during the test operation to select a row, duplicate data stored in memory cells connected in the selected row, store the duplicated data in the dummy register, perform a weak write operation on the memory cells connected in the selected row, and then, compare the duplicated data stored in the dummy register with the data stored in the memory cells connected in the selected row to generate the weak cell information.

6. The resistive memory device of claim 4, wherein the memory cell array comprises an information register that stores the weak cell information.

7. The resistive memory device of claim 2, wherein the control circuit is further configured to perform the test operation during system boot for the resistive memory device.

8. The resistive memory device of claim 1, wherein each one of the plurality of memory cells is a magnetic random access memory (MRAM) cell.

9. The resistive memory device of claim 3, wherein the memory cell array comprises a dummy row integral to the memory block and having a same configuration as each one of the plurality of rows.

10. The resistive memory device of claim 9, wherein the control circuit and the BIST are further configured during the test operation to select a row, duplicate data stored in memory cells connected in the selected row, store the duplicated data in the dummy row, perform a weak write operation on the memory cells connected in the selected row, and then, compare the duplicated data stored in the dummy row with the data stored in the memory cells connected in the selected row to generate the weak cell information.

11. The resistive memory device of claim 10, wherein the memory cell array further comprises an information register that stores the weak cell information.

12. The resistive memory device of claim 1, wherein the memory cell array is a stacked, three-dimensional memory cell array.

13. A method of writing data in a resistive memory device, wherein the resistive memory device includes a plurality of memory cells arranged in a memory block defined by a plurality of rows, each row including a word line connecting memory cells, and the method comprises:
performing a test operation on memory cells in the memory block to distinguish normal memory cells from weak memory cells among the plurality of memory cells, wherein the weak memory cells exhibit relatively poor magnetization, as compared with the normal memory cells;

during a normal write operation directed to a row including normal memory cells, generating a first write current and applying the first current to the normal memory cells; and during a weak write operation directed to a row including weak memory cells, generating a second write current having a higher level than the first write current and applying the second current to the weak memory cells.

14. The method of claim 13, wherein the test operation is performed during system boot for the resistive memory device.

15. The method of claim 13, wherein performing the test operation comprises:

using a built-in self-test (BIST) circuit of the resistive memory device to generate weak cell information identifying the weak memory cells.

16. The method of claim 15, wherein performing the test operation further comprises:

selecting a row;

duplicating data stored in memory cells of the selected row and storing the duplicated data in a dummy register of the BIST;

performing the weak write operation on the memory cells of the selected row; and then, comparing the duplicated data stored in the dummy register with the data stored in the memory cells of the selected row to generate the weak cell information.

17. The method of claim 16, wherein performing the test operation further comprises storing the weak cell information in an information register in the memory cell array.

18. The method of claim 15, wherein performing the test operation further comprises:

selecting a row;

duplicating data stored in memory cells of the selected row and storing the duplicated data in a dummy row of the memory block;

performing the weak write operation on the memory cells of the selected row; and then, comparing the duplicated data stored in the dummy row with the data stored in the memory cells of the selected row to generate the weak cell information.

19. The method of claim 18, wherein performing the test operation further comprises storing the weak cell information in an information register in the memory cell array.

20. The method of claim 13, wherein the memory cell array is a stacked, three-dimensional memory cell array.

* * * * *